(12) United States Patent
Hallquist et al.

(10) Patent No.: US 8,200,458 B2
(45) Date of Patent: Jun. 12, 2012

(54) CREATION OF SIMULATED DISJOINT RIGID BODIES IN A FINITE ELEMENT ANALYSIS

(75) Inventors: John O. Hallquist, Livermore, CA (US); Brian Wainscott, San Ramon, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 287 days.

(21) Appl. No.: 12/641,276

(22) Filed: Dec. 17, 2009

(65) Prior Publication Data

US 2011/0093240 A1    Apr. 21, 2011

Related U.S. Application Data

(60) Provisional application No. 61/253,161, filed on Oct. 20, 2009.

(51) Int. Cl.
*G06F 17/50*    (2006.01)
(52) U.S. Cl. .......................................................... 703/1
(58) Field of Classification Search ........................ 703/1
See application file for complete search history.

(56) References Cited

OTHER PUBLICATIONS

Lin: DYNA3D: A Nonlinear, Explicit, Three-Dimensional Finite Element Code for Solid and Structural Mechanics User Manual: pp. 1-618; UCRL-MA-107254, Jan. 2005.*
EPO Extended Search Report for Application Ser. No. 10186506.1-2224, Jan. 12, 2011.
EPO Notice of Publication for Application Ser. No. 10186506.1-2224, Apr. 20, 2011.
EPO Office Action for Application Ser. No. 10186506.1, May 17, 2011.

* cited by examiner

*Primary Examiner* — Hugh Jones
(74) *Attorney, Agent, or Firm* — Roger H. Chu

(57) ABSTRACT

Improved methods and systems for defining and creating simulated rigid bodies in finite element analysis are disclosed. One or more rigid finite elements in a finite element model are designated for forming one or more simulated rigid bodies (RBs). Each simulated RB comprises an arbitrary number of rigid finite elements connecting to one another in an arbitrary shape. Each simulated RB is created by locating all of the elements embedded in the model through shared node or nodes. A procedure of using element definition as a guide to set up an array of node flags, each node flag for one node such that all RBs defined in the model can be located efficiently. Once all RBs have been located, each unique RB is defined as a unique list of connected rigid finite elements.

7 Claims, 4 Drawing Sheets

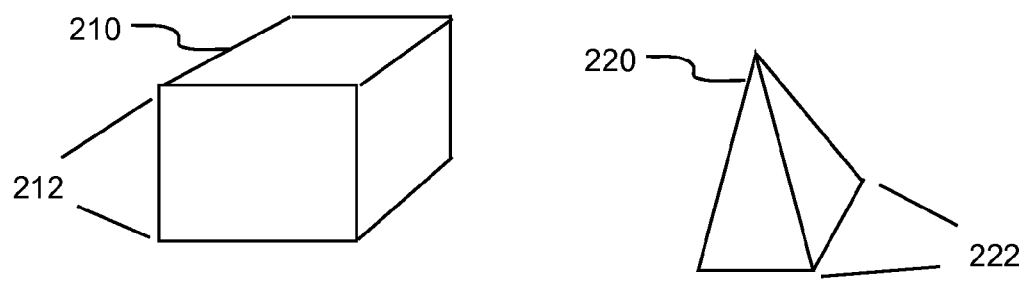
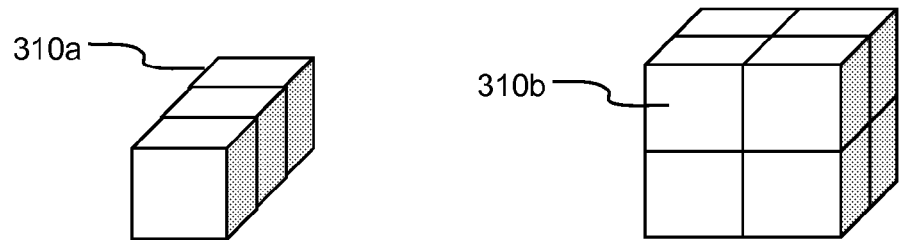
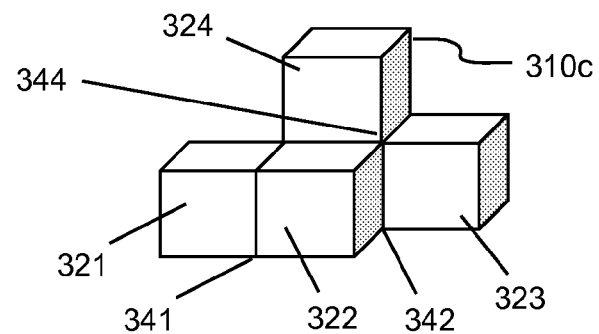
*FIG. 3*

CREATION OF SIMULATED DISJOINT RIGID BODIES IN A FINITE ELEMENT ANALYSIS

CROSS REFERENCE TO RELATED APPLICATIONS

This application claims priority from a U.S. Provisional Patent Application Ser. No. 61/253,161 for "CREATION OF SIMULATED DISJOINT RIGID BODIES IN A FINITE ELEMENT ANALYSIS", filed Oct. 20, 2009, the entire contents of which are incorporated herein by reference.

FIELD OF THE INVENTION

The present invention generally relates to computer aided engineering analysis, more particularly to systems and methods of creating simulated rigid bodies (RBs) in a finite element analysis without explicitly defining any identifier for RBs.

BACKGROUND OF THE INVENTION

Computer aided engineering (CAE) has been used for supporting engineers in many tasks. For example, in a structure or engineering product design procedure, CAE analysis, particularly finite element analysis (FEA), has often been employed to evaluate simulated responses (e.g., stresses, displacements, etc.) under various simulated loading conditions (e.g., static or dynamic).

FEA is a computerized method widely used in industry to simulate (i.e., model and solve) engineering problems relating to complex products or systems (e.g., cars, airplanes, consumer products, etc.) such as three-dimensional non-linear structural design and analysis. FEA derives its name from the manner in which the geometry of the object under consideration is specified. The geometry is defined by elements and nodal points. There are a number of types of elements, solid elements for volumes or continua, shell or plate elements for surfaces and beam or truss elements for one-dimensional structure objects. The geometry of each element is defined by nodal points, for example, a brick or hexahedral element comprising eight corner nodes.

Generally these elements are deformable under loading. However, in certain application, rigid finite elements or rigid elements are required. Rigid elements are not deformed under any loading condition. Rigid elements can be used for modeling structural components, for example, bolts, discrete particles or rigid bodies. In order to model rigid body, one of the prior art approaches is to create a rigid body type element. All rigid bodies need to be defined with an identifier used for identifying each individual rigid body. For example, if there are two different rigid bodies defined in a finite element analysis model, two unique identifiers must be created such that rigid elements, which are assigned one of the two unique identifiers, are grouped together. For each rigid body, the inertial properties are computed from the geometry of the rigid elements included within the rigid body. While this approach is straightforward for a relatively small number of rigid bodies, it is not feasible when a finite element analysis model contains a large number of rigid bodies (e.g., tens of thousands to millions). It would require a tremendous amount of man hours (i.e., costs) to define the large number of RBs hence not feasible in a production environment.

Many of today's engineering simulations require such capability (i.e., having millions of RBs), for example, simulating millions of particles filling into a container. It would, therefore, be desirable to have methods and systems for defining and creating a large number of rigid bodies efficiently without the complexity of providing a special identifier for every rigid body. Each rigid body can contain an arbitrary number of rigid finite elements that are arranged in an arbitrary shape.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems for defining and creating simulated rigid bodies (RBs) in a finite element analysis without explicitly defining any identifier for RBs are disclosed. According to one aspect of the present invention, one or more rigid elements or rigid finite elements are defined in a finite element analysis model. For example, the rigid element may be defined as having a specially-designated material. A rigid element is configured to be a portion for forming one or more simulated RBs. Each simulated RB comprises an arbitrary number of rigid elements that are connected to one another in an arbitrary orientation. No identifier for RBs is required in the input description or definition.

According to another aspect of the invention, each RB is represented with a unique linked list of rigid elements. To locate RBs embedded within a finite element model or finite element analysis model, a procedure of creating all linked lists (i.e., RBs) is described below. The procedure loops through all of the rigid elements only once. For each of the rigid elements, there are three possible situations:

(1) None of its neighbors are yet part of a linked list;
(2) All of its neighbors that are part of a linked list are all part of the same linked list; and
(3) Its neighbors come from different linked list.

After all of the linked lists representing RBs have been identified and created, physical properties of each RB are calculated from corresponding rigid elements contained therein. Finite element analysis of an engineering product (e.g., car, airplane, particles, consumer products, etc.) can then be carried out in a normal manner including all RBs. In one exemplary usage, a large number of granular particles are modeled as RBs with one RB per granular particle. Interactions (e.g., contacts, collisions, etc.) amongst RBs can be calculated or simulated using the finite element analysis.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 2 is a diagram showing exemplary solid elements of a finite element analysis model;

FIG. 3 is a diagram showing exemplary simulated rigid bodies, according to an embodiment of the present invention.

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-4. However, those skilled in the art will readily appreciate that the detailed description given herein with respect to these figures is for explanatory purposes as the invention extends beyond these limited embodiments.

Figure 1A:
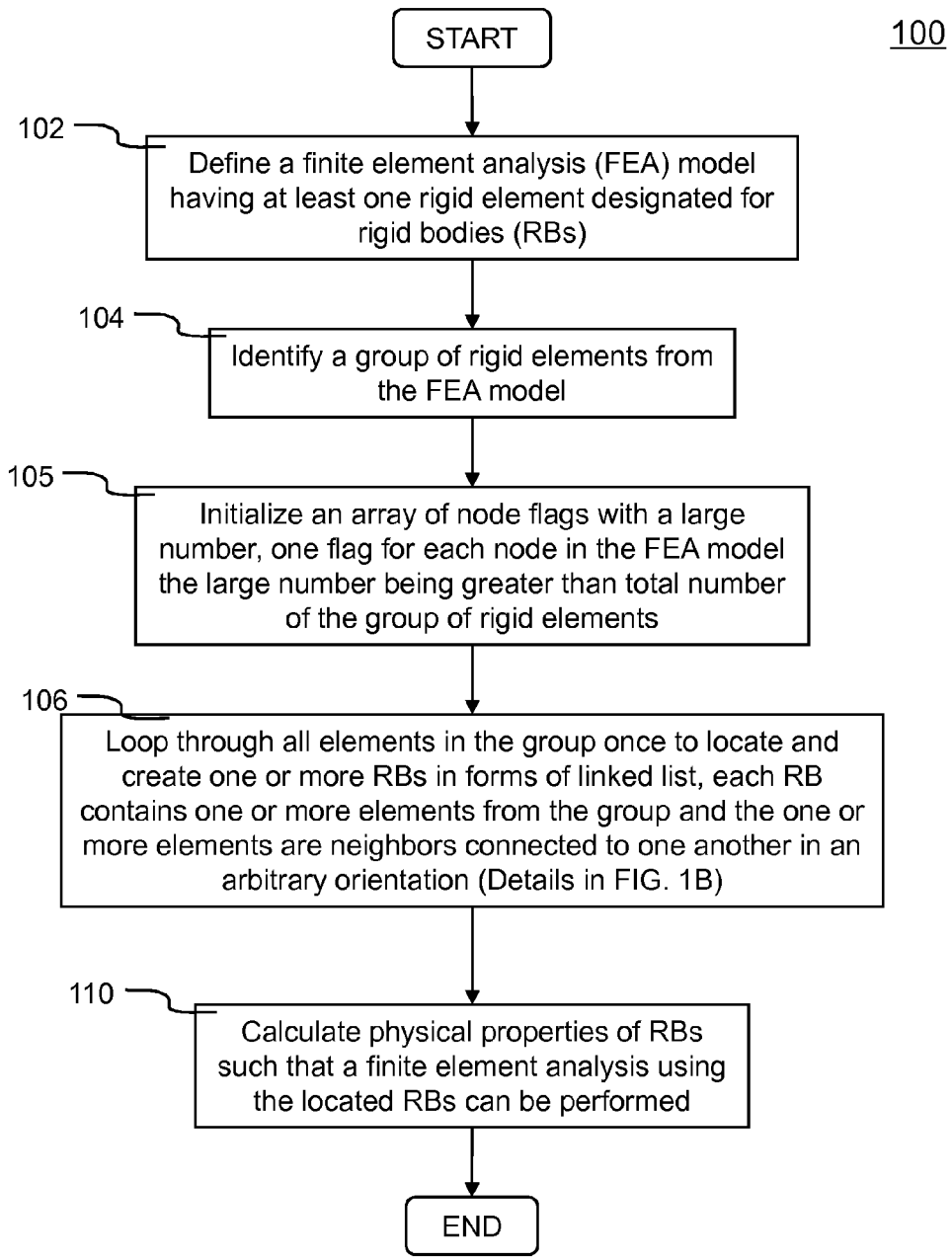
FIG. 1A and FIG. 1B collectively are a flowchart illustrating an exemplary process of creating numerically simulated rigid bodies in a finite element analysis, according to an embodiment of present invention.
Figure 1B:
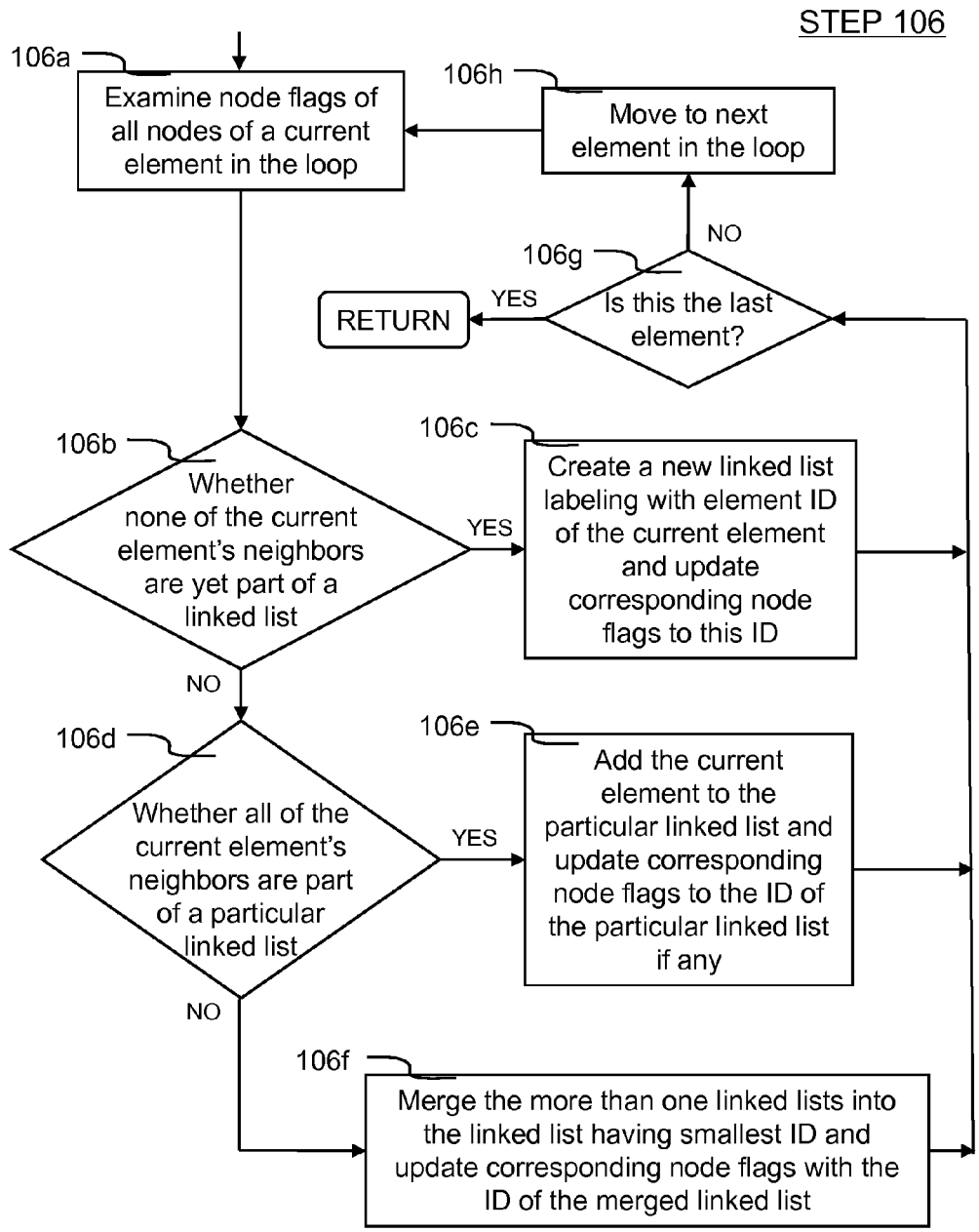

Referring first to FIGS. 1A and 1B, it is shown a flowchart illustrating an exemplary process 100 of creating simulated rigid bodies in a finite element analysis for assisting user to make design decision in improvement of an engineering product (e.g., car, airplane), according to an embodiment of the present invention. Process 100 is preferably implemented in software.

Process 100 starts, at step 102, by defining a finite element analysis (FEA) model that models an engineering product to be designed or improved. The FEA model includes a number of nodal points and a number of elements including at least one rigid finite element for forming simulated rigid body. In one embodiment, a group of rigid elements in step 104 is created by user as a solid element having a specially-designated material (e.g., rigid material), which indicates that these rigid elements are configured for forming rigid bodies. There is no requirement for explicitly defining each individual rigid body (RB). All RBs are embedded in the FEA model. Each RB is defined as a group of neighbors connecting to one another in an arbitrary orientation. Process 100 is configured to locate each of the defined rigid bodies via element node-definition or connectivity information of the rigid elements, and then to create a numerical representation (i.e., a unique linked list for each RB). In addition, other material properties (i.e., physical quantities) can also be specified by the user for each rigid material type, for example, mass density.

Any RB can be formed by different combination/orientation of rigid elements. For example, two such rigid solid elements, hexahedral 210 and tetrahedral elements 220 are shown in FIG. 2. The hexahedral element 210 is defined by eight corner nodes 212 (one not shown), while the tetrahedral element 220 defined by four corner nodes 222 (one not shown). In general, the node-definition is referred to respective corner nodes for each element. All nodes that define the geometry of solid elements are initially defined in the FEA model.

FIG. 3 is a diagram showing three different simulated RBs 310a-c in accordance with one embodiment of the present invention. The RBs 310a-c are configured with an arbitrary number of rigid elements that are arranged in arbitrary shape (i.e., solid elements connected together in various arbitrary orientations). For example, elements 321-324 are connected to one another to form rigid body 310c via common shared nodes: node 341 is shared between elements 321 and 322; node 342 is shared between elements 322 and 323; and node 344 is shared among three elements 322, 323 and 324.

Referring back to FIG. 1, after step 104, process 100 creates an array of node flags with each flag corresponding to a node in the FEA model at step 105. The array of node flags is then initialized to a large number greater than total number of elements in the group of the rigid elements.

Next at step 106, process 100 locates all rigid elements and creates all of the rigid bodies in forms of linked lists. In other words, each linked list represents a particular RB, which is formed with a set of unique rigid elements. Any particular rigid element can only be configured to be a portion of one rigid body. Due to arbitrary shape of the rigid bodies, each linked list can include an arbitrary number of rigid elements. As long as the rigid elements are connected to one another, those elements belong to a particular rigid body. For example, first and second elements may share a first node, while first and third elements share a second node. And the first and second node may or may not be the same.

According to one embodiment, the above described function is accomplished by step 106 shown in FIG. 1B. Step 106 loops through all of the rigid elements only once to create one or more numerical representation (i.e., linked-list) of the RBs using element-node connectivity information (e.g., corner nodes). During the looping operation, at each currently processed element (current element identifiable by a current element ID), node flags of all nodes of the current element are examined at 106a. There are three possible situations:

(1) None of its neighbors are yet part of a linked list;
(2) All of its neighbors that are part of a linked list are all part of the same linked list (i.e., one particular linked list); and
(3) Its neighbors come from different linked lists (i.e., more than one linked lists).

At decision 106b, it is determined whether none of the current element's neighbors are yet part of a linked list. If "Yes", process 100 creates a new linked list (representing a RB) and labels the new linked list with the element ID (e.g., element number) of the current element at step 106c. Additionally process 100 updates all corresponding node flags to the current element ID. In other words, the node flags of those nodes of the current element are changed to the current element ID at step 106c. Next, process 100 moves to decision 106g thereafter. It is noted the element number is based on a sequential numbering scheme generally used within FEA software (e.g., internal element number).

Referring back to decision 106b, if "No", process 100 moves to another decision 106d. It is determined whether all of the current element's neighbors are part of a particular linked list. If "yes", process 100 moves to step 106e to add the current element to the particular linked list and update corresponding node flags to the ID of the particular linked list if any. Process 100 moves to decision 106g thereafter.

Otherwise if "No" at decision 106d, process 100 moves to step 106f. This is the situation (3) stated above (i.e., current element's neighbors belong to more than one linked lists). At step 106f, process 100 merges all of the more than one linked lists into the linked list having smallest ID (i.e., lowest linked list ID number) and updates corresponding node flags accordingly with the ID of the merged linked list. Again, process 100 moves to decision 106g, in which it is determined whether the current element is the last in the loop. If "No", process 100 moves to next element in the loop and goes back to step 106a to process next element in the loop. Otherwise step 106 ends and process 100 returns.

Finally at step 110, process 100 calculates physical properties of each formed rigid body based on respective elements in each corresponding linked list (e.g., total mass, initial momentum and energy of the rigid body). Then the finite element analysis can be performed for these rigid bodies properly. Process 100 ends thereafter.

Figure 4:
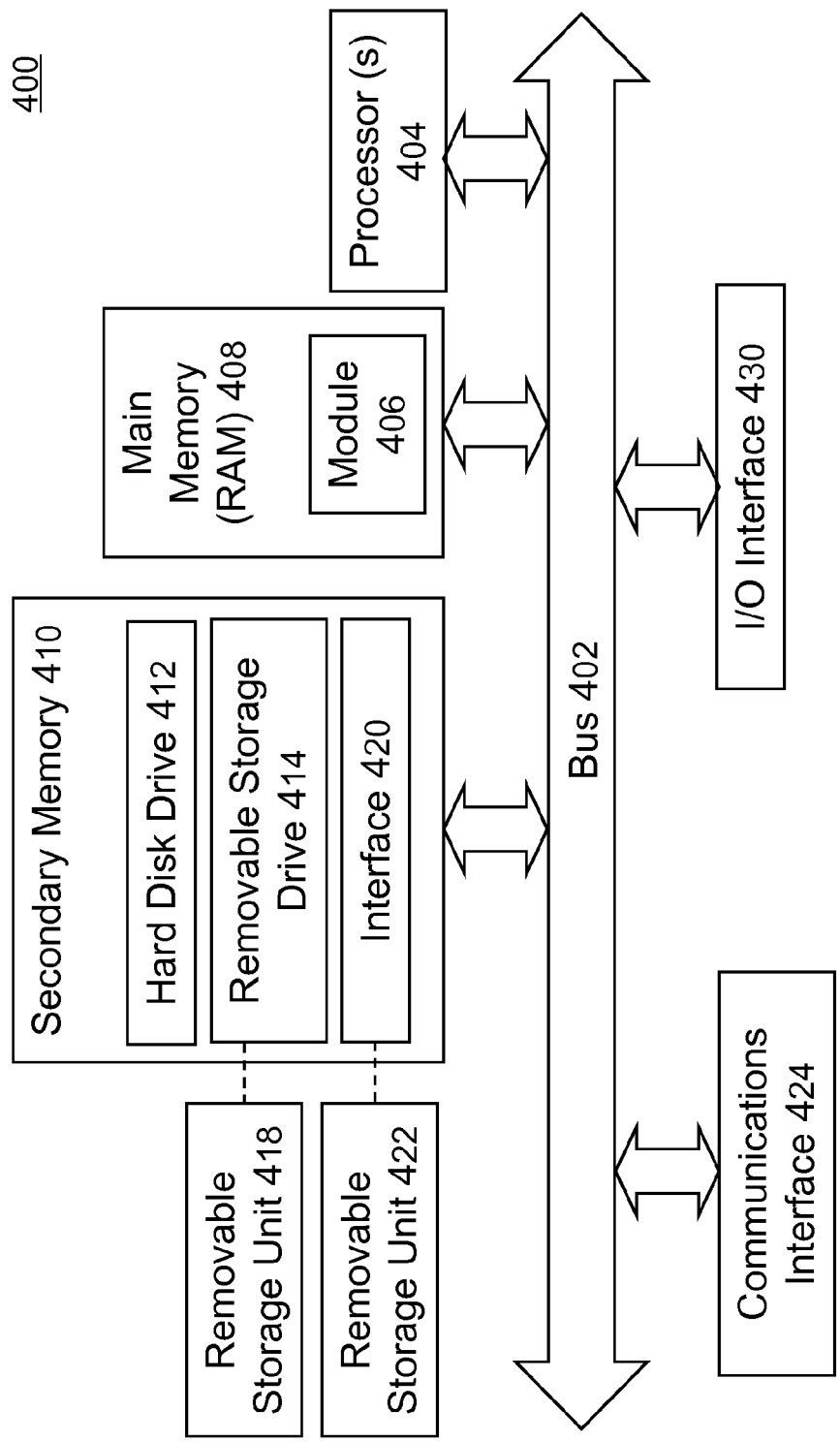
FIG. 4 is a function diagram showing salient components of a computer system, in which an embodiment of the present invention may be implemented.

According to one aspect, the present invention is directed towards one or more computer systems capable of carrying out the functionality described herein. An example of a computer system 400 is shown in FIG. 4. The computer system 400 includes one or more processors, such as processor 404. The processor 404 is connected to a computer system internal communication bus 402. Various software embodiments are described in terms of this exemplary computer system. After reading this description, it will become apparent to a person skilled in the relevant art(s) how to implement the invention using other computer systems and/or computer architectures.

Computer system 400 also includes a main memory 408, preferably random access memory (RAM), and may also include a secondary memory 410. The secondary memory 410 may include, for example, one or more hard disk drives 412 and/or one or more removable storage drives 414, representing a floppy disk drive, a magnetic tape drive, an optical disk drive, etc. The removable storage drive 414 reads from and/or writes to a removable storage unit 418 in a well-known manner. Removable storage unit 418, represents a floppy disk, magnetic tape, optical disk, etc. which is read by and written to by removable storage drive 414. As will be appreciated, the removable storage unit 418 includes a computer readable medium having stored therein computer software and/or data.

In alternative embodiments, secondary memory 410 may include other similar means for allowing computer programs or other instructions to be loaded into computer system 400. Such means may include, for example, a removable storage unit 422 and an interface 420. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 422 and interfaces 420 which allow software and data to be transferred from the removable storage unit 422 to computer system 400. In general, Computer system 400 is controlled and coordinated by operating system (OS) software, which performs tasks such as process scheduling, memory management, networking and I/O services.

There may also be a communications interface 424 connecting to the bus 402. Communications interface 424 allows software and data to be transferred between computer system 400 and external devices. Examples of communications interface 424 may include a modem, a network interface (such as an Ethernet card), a communications port, a Personal Computer Memory Card International Association (PCMCIA) slot and card, etc.

The computer 400 communicates with other computing devices over a data network based on a special set of rules (i.e., a protocol). One of the common protocols is TCP/IP (Transmission Control Protocol/Internet Protocol) commonly used in the Internet. In general, the communication interface 424 manages the assembling of a data file into smaller packets that are transmitted over the data network or reassembles received packets into the original data file. In addition, the communication interface 424 handles the address part of each packet so that it gets to the right destination or intercepts packets destined for the computer 400.

In this document, the terms "computer recordable storage medium", "computer recordable medium" and "computer readable medium" are used to generally refer to media such as removable storage drive 414, and/or a hard disk installed in hard disk drive 412. These computer program products are means for providing software to computer system 400. The invention is directed to such computer program products.

The computer system 400 may also include an input/output (I/O) interface 430, which provides the computer system 400 to access monitor, keyboard, mouse, printer, scanner, plotter, and alike.

Computer programs (also called computer control logic) are stored as application modules 406 in main memory 408 and/or secondary memory 410. Computer programs may also be received via communications interface 424. Such computer programs, when executed, enable the computer system 400 to perform the features of the present invention as discussed herein. In particular, the computer programs, when executed, enable the processor 404 to perform features of the present invention. Accordingly, such computer programs represent controllers of the computer system 400.

In an embodiment where the invention is implemented using software, the software may be stored in a computer program product and loaded into computer system 400 using removable storage drive 414, hard drive 412, or communications interface 424. The application module 406, when executed by the processor 404, causes the processor 404 to perform the functions of the invention as described herein.

The main memory 408 may be loaded with one or more application modules 406 (e.g., a finite element analysis application module) that can be executed by one or more processors 404 with or without a user input through the I/O interface 430 to achieve desired tasks (e.g., creating simulated rigid bodies). In operation, when at least one processor 404 executes one of the application modules 406, the results are computed and stored in the secondary memory 410 (i.e., hard disk drive 412). The status of the time-marching engineering simulation (e.g., deformed beam element, deformed surface, and their relative position, etc.) is reported to the user via the I/O interface 430 either in a text or in a graphical form.

Finally, to ensure computation efficiency in simulating RBs in a massively parallel computer, a special technique is used during initial computing load balancing phase (e.g., domain decomposition). Traditionally domain decomposition is element based technique. Each element is assigned a weight (computational cost), and the decomposition attempts to assign elements to processors in such a way as to balance these weights on each processor—so each processor gets the same total weight. For RBs, it is modified as follows: for each RB, the total weight of the elements in that RB is computed. The total weight is then assigned to particular one of the elements in the RB, and the weights of the rest are reset to 0. Decomposition is then performed as usual, and each element is assigned to a processor. And for each RB, all the elements are reassigned to whichever processor ended up owning the particular one element that had non-zero weight. This maintains the total weight distribution during the decomposition, while ensuring that all the elements of a RB end up on the same processor.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas linked-list has been described to represent RB, other equivalent data structure can be used instead, for example, a simple list. Additionally, whereas three-dimensional finite elements have been shown and described to be rigid elements, one- or two-dimensional finite elements can also be used for forming RBs, (e.g., beams, trusses, plates, etc.). Furthermore, whereas hexahedral elements have been shown and described to form rigid bodies, other types of solid elements can be used, for example, tetrahedral, pentahedral elements. Moreover, whereas only few exemplary rigid bodies have been described and shown, majority use of the present invention includes a large number (e.g., millions) of rigid bodies. In summary, the scope of the invention should not be restricted to the specific exemplary embodiments disclosed herein, and all modifications that are readily suggested to those of ordinary skill in the art should be included within the spirit and purview of this application and scope of the appended claims.

We claim:

1. A method of creating numerically simulated rigid bodies representing a large number of granular particles in a finite element analysis in a CAE system comprising:

defining, in a computer system having a finite element analysis application module installed thereon, a finite element analysis model having a plurality of nodal points and at least one rigid finite element, each of the at least one rigid finite element having a set of user defined information representing one or more physical quantities;

creating an array of node flags each flag being associated with corresponding one of the plurality of nodal points and being initialized with a value that is greater than largest identification (ID) of all of said at least one rigid finite element and then looping through said all of the at least one rigid finite element once, wherein at each currently processed element in said looping, examining corresponding node flags of the currently processed element's nodes;

when said corresponding node flags contain only the initialized value, creating a new list representing one of one or more simulated rigid bodies and labeled said new list with the currently processed element's ID and updating the corresponding node flags with the ID;

when said corresponding node flags contain either the initialized numerical value or a particular list's ID, adding the currently processed element into the particular list and updating the corresponding node flags with the particular list's ID;

when said corresponding node flags contain more than one lists' ID, merging all of the more than one lists into one of the said more than one lists having smallest ID, updating the corresponding node flags with the smallest ID; and calculating a set of physical properties of said each simulated rigid body in accordance with the set of user defined information corresponding each rigid finite element in said corresponding list such that said each simulated rigid body is set up to be processed in the finite element analysis for assisting user to make decision in improvement of engineering product design.

2. The method of claim 1, wherein said one or more physical quantities comprise a mass density.

3. The method of claim 1, wherein said those rigid finite elements include a first rigid finite element and a second rigid finite element sharing a first node, while the first rigid finite element and a third rigid finite element share a second node.

4. A system for creating numerically simulated rigid bodies in a finite element analysis comprising:

a main memory for storing computer readable code for a finite element analysis application module;

at least one processor coupled to the main memory, said at least one processor executing the computer readable code in the main memory to cause the application module to perform operations by a method of:

defining a finite element analysis model having a plurality of nodal points and at least one rigid finite element, each of the at least one rigid finite element having a set of user defined information representing one or more physical quantities;

creating an array of node flags each flag being associated with corresponding one of the plurality of nodal points and being initialized with a value that is greater than largest identification (ID) of all of said at least one rigid finite element and then looping through said all of the at least one rigid finite element once, wherein at each currently processed element in said looping, examining corresponding node flags of the currently processed element's nodes;

when said corresponding node flags contain only the initialized value, creating a new list representing one of one or more simulated rigid bodies and labeled said new list with the currently processed element's ID and updating the corresponding node flags with the ID;

when said corresponding node flags contain either the initialized numerical value or a particular list's ID, adding the currently processed element into the particular list and updating the corresponding node flags with the particular list's ID;

when said corresponding node flags contain more than one lists' ID, merging all of the more than one lists into one of the said more than one lists having smallest ID, updating the corresponding node flags with the smallest ID; and calculating a set of physical properties of said each simulated rigid body in accordance with the set of user defined information corresponding each rigid finite element in said corresponding list such that said each simulated rigid body is set up to be processed in the finite element analysis for assisting user to make decision in improvement of engineering product design.

5. The system of claim 4 wherein said those rigid finite elements include a first rigid finite element and a second rigid finite element sharing a first node, while the first rigid finite element and a third rigid finite element share a second node.

6. A non-transitory computer readable storage medium containing instructions for controlling a computer system for creating numerically simulated rigid bodies in a finite element analysis by a method comprising:

defining, in a computer system having a finite element analysis application module installed thereon, a finite element analysis model having a plurality of node points and at least one rigid finite element, each of the at least one rigid finite element having a set of user defined information representing one or more physical quantities;

creating an array of node flags each flag being associated with corresponding one of the plurality of nodal points and being initialized with a value that is greater than largest identification (ID) of all of said at least one rigid finite element and then looping through said all of the at least one rigid finite element once, wherein at each currently processed element in said looping, examining corresponding node flags of the currently processed element's nodes;

when said corresponding node flags contain only the initialized value, creating a new list representing one of one or more simulated rigid bodies and labeled said new list with the currently processed element's ID and updating the corresponding node flags with the ID;

when said corresponding node flags contain either the initialized numerical value or a particular list's ID, adding the currently processed element into the particular list and updating the corresponding node flags with the particular list's ID;

when said corresponding node flags contain more than one lists' ID, merging all of the more than one lists into one of the said more than one lists having smallest ID, updating the corresponding node flags with the smallest ID; and calculating a set of physical properties of said each simulated rigid body in accordance with the set of user defined information corresponding each rigid finite element in said corresponding list such that said each simulated rigid body is set up to be processed in the finite element analysis for assisting user to make decision in improvement of engineering product design.

7. The non-transitory computer readable storage medium of claim 6 wherein said those rigid finite elements include a first rigid finite element and a second rigid finite element sharing a first node, while the first rigid finite element and a third rigid finite element share a second node.

* * * * *